United States Patent [19]

Akaogi et al.

[11] Patent Number: 4,773,046

[45] Date of Patent: Sep. 20, 1988

[54] SEMICONDUCTOR DEVICE HAVING FUSE CIRCUIT AND DETECTING CIRCUIT FOR DETECTING STATES OF FUSES IN THE FUSE CIRCUIT

[75] Inventors: Takao Akaogi; Hiromi Kawashima, both of Kawasaki, Japan

[73] Assignee: Fujitsu Limited, Kawasaki, Japan

[21] Appl. No.: 60,018

[22] Filed: Jun. 9, 1987

[30] Foreign Application Priority Data

Jun. 11, 1986 [JP] Japan .................................. 61-133782

[51] Int. Cl.[4] ........................ G11C 13/00; G11C 11/36
[52] U.S. Cl. .................................... 365/96; 365/189; 365/207
[58] Field of Search ................... 365/94, 96, 100, 207, 365/189, 206

[56] References Cited

U.S. PATENT DOCUMENTS 4,734,885  3/1988  Lulch ..................................... 365/96

Primary Examiner—Terrell W. Fears
Attorney, Agent, or Firm—Staas & Halsey

[57] ABSTRACT

A semiconductor device comprises a fuse circuit having first and second fuses for storing an information bit represented by blown or unblown states of the fuses. The device uses an information output circuit for providing an output signal having a first logic level when at least one of the fuses is blown and an output signal having a second logic level when both the fuses are unblown. A detecting circuit in the device detects which one of the fuses is unblown.

4 Claims, 3 Drawing Sheets

SEMICONDUCTOR DEVICE HAVING FUSE CIRCUIT AND DETECTING CIRCUIT FOR DETECTING STATES OF FUSES IN THE FUSE CIRCUIT

BACKGROUND OF THE INVENTION

The present invention generally relates to semiconductor devices having detecting circuits for detecting states of fuses in fuse circuits, and more particularly to a semiconductor device having a fuse circuit provided with pairs of fuses and a detecting circuit for detecting states of each pair of fuses in the fuse circuit.

Fuses which are blown by electrical or laser programming are often used in semiconductor devices. For example, fuses are used in a semiconductor memory device employing a redundancy configuration, so that redundancy memory cells may be used in place of defective memory cells. In addition, fuses are often used to select one or a plurality of circuit elements such as resistors provided in a semiconductor device.

In the case of the semiconductor memory device such as a random access memory (RAM), a large number of memory cells are arranged along rows and columns. The density of defects generated in the memory device in the manufacturing process is relatively independent of the integration density of the memory device and is dependent on the manufacturing technology. In general, the higher the integration density of the memory device, the greater the ratio of normal memory cells to defective memory cells. This is one of the advantages of increasing the integration density of the memory device.

However, when the memory device includes defective memory cells, the memory device will not operate correctly and must therefore be destroyed. As a result, despite the low ratio of defective memory cells to the normal memory cells, the manufacturing yield of the memory device is reduced. In order to overcome this problem of defective memory cells, the memory device employs the redundancy configuration. According to the redundancy configuration, one or two rows or columns of redundancy memory cells are provided, and a row or column of redundancy memory cells is selected instead of a defective row or column of memory cells when a defective memory cell is detected in the defective row or column. A redundancy control circuit is provided to store address information of such a defective row or column of memory cells and to disable regular decoders for selecting normal memory cells, so as to select the row or column of redundancy memory cells in response to an address of the defective row or column. The redundancy control circuit comprises fuse-type read only memories (ROMs) each having an information storing circuit.

A unit information storing circuit in a prior art device incorporates one fuse for each bit of the address information to be stored. Therefore, the information storing circuit stores a datum "1" or "0" by a blown or unblown fuse. For example, when writing the datum "1", a polysilicon fuse is blown by electrical or laser programming. However, especially when the polysilicon fuse is blown by the electrical programming, the polysilicon fuse may grow back during the life of the memory device. For this reason, when only one fuse is provided for one bit of the address information and the grow back occurs, it is impossible to make use of the redundancy memory cells and the reliability of the memory device is unsatisfactory.

Accordingly, an improved memory device was previously proposed in a U.S. Pat. No. 4,592,025 in which the assignee is the same as the assignee of the present application. According to this previously proposed memory device, two fuses are provided for one bit of the address information. For example, when writing the datum "1", both of the two fuses are blown by electrical or laser programming. A detection to determine the states of the fuses may be carried out by obtaining a logical sum of signals obtained via the two fuses. From the logical sum, it is possible to detect whether the two fuses are both unblown or at least one of the two fuses is blown. Hence, in the above case, even when the two fuses are blown by the electrical programming but one of the fuses grows back, it is still possible to detect that the bit of the address information is intended to contain the datum "1". As a result, the reliability of the memory device is greatly improved compared to the prior art device in which only one fuse is provided for one bit of the address information, because the probability that both the two blown fuses will grow back is considerably small compared to the probability that the single fuse will grow back.

But in actual practice, the fuses need to be re-programmed if the fuses which should be blown are actually unblown due to incomplete programming or grow back. It is easy to detect the state of the fuse when only one fuse is provided for one bit of the address information. However, when two fuses are provided for one bit of the address information, it is impossible to know from the logical sum described above whether only one of the two fuses is blown or both the two fuses are blown. Furthermore, in the case where only one of the two fuses is blown, it is impossible to discriminate which one of the two fuses is blown.

When two fuses are provided for one bit of the address information but one of the two fuses which should be blown is actually unblown, the situation is the same as the prior art device described before. In other words, when the blown fuse grows back, there is a problem in that it is impossible to make use of the redundancy memory cells and the reliability of the memory device is unsatisfactory. Hence, in this case, it is desirable to discriminate which one of the two fuses is unblown and re-program the unblown fuse so that both the two fuses are blown as originally intended.

SUMMARY OF THE INVENTION

Accordingly, it is a general object of the present invention to provide a semiconductor device having a fuse circuit and a detecting circuit for detecting states of fuses in the fuse circuit, in which the problems described heretofore are eliminated.

Another and more specific object of the present invention is to provide a semiconductor device comprising a fuse circuit having pairs of fuses for storing an information bit by use of one pair of fuses, and a detecting circuit for detecting the states within each pair of fuses in the fuse circuit.

According to the semiconductor device of the present invention, it is possible to detect the state of each pair of fuses with ease. Even when only one fuse of a pair of fuses is blown, it is possible to positively detect which one of the fuses is unblown. Therefore, the present invention is especially suited for a semiconductor memory device having a redundancy configuration.

The present invention can also be applied to a semiconductor device having a selection circuit for selecting one or a plurality of circuit elements such as resistors, where the fuse circuit stores address information for controlling the selection circuit so as to selectively use predetermined circuit elements on the semiconductor device.

Other objects and further features of the present invention will be apparent from the following detailed description when read in conjunction with the accompanying drawings.

DESCRIPTION OF THE PREFERRED EMBODIMENTS

Figure 1:
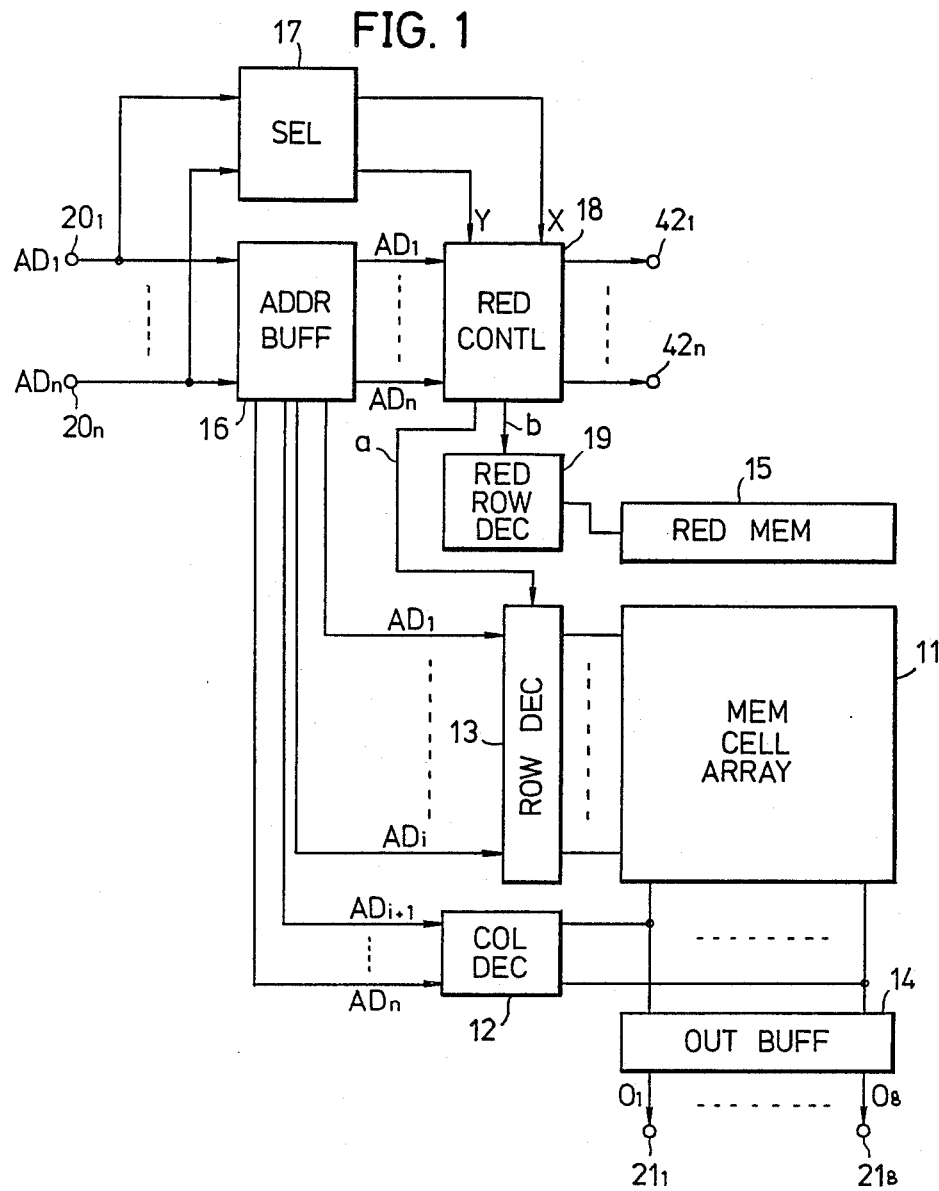
FIG. 1 is a system block diagram showing an embodiment of the semiconductor device according to the present invention applied to a semiconductor memory device employing a redundancy configuration.

FIG. 1 shows an embodiment of the present invention applied to a semiconductor memory device having a redundancy configuration. The semiconductor memory device comprises a memory cell array 11, a column decoder 12, a row decoder 13, an output buffer 14, redundancy memory cells 15, an address buffer 16, a selection circuit 17, a redundancy control circuit 18, and a redundancy row decoder 19.

An n-bit address signal applied to terminals $20_1$ through $20_n$ is supplied to the address buffer 16, and bits $AD_1$ through $AD_i$ of the address signal are supplied to the row decoder 13 while bits $AD_{i+1}$ through $AD_n$ are supplied to the column decoder 12. The row decoder 13 and the column decoder 12 decode the address bits and respectively designate predetermined row and column addresses in the memory cell array 11. A stored datum at the address designated by the row and column decoders 13 and 12 is read out from the memory cell array 11 and is passed through the output buffer 14. Bits $O_1$ through $O_8$ of the read out datum are outputted via terminals $21_1$ through $21_8$.

The redundancy control circuit 18 comprises a memory circuit for storing addresses of defective memory cells in the memory cell array 11, a comparing circuit for comparing the input address and the address of the defective memory cell stored in the memory circuit, and a detecting circuit for detecting states of fuses in the memory circuit. The comparing circuit of the redundancy control circuit 18 is supplied with the address bits $AD_1$ through $AD_n$ obtained via the address buffer 16, and produces a disable signal (a) for disabling the row decoder 13 and an enable signal (b) for enabling the redundancy row decoder 19 when the input address from the address buffer 16 coincides with the address of the defective memory cell stored in the memory circuit. For this reason, when the input address designates a defective memory cell, one of the redundancy memory cells 15 is accessed instead of the defective memory cell.

As will be described later, the memory circuit of the redundancy control circuit 18 comprises a fuse type read only memory (ROM). Each address bit in the address of the defective memory cell is described by the state of a pair of fuses of the fuse ROM. The selection circuit 17 generates check signals X and Y responsive to bits $AD_1$ and $AD_n$ of the input address. The redundancy control circuit 18 produces a detection signal indicative of the state of each fuse within a fuse pair based on the check signals X and Y. For example, the selection circuit 17 comprises inverters (not shown) having high threshold levels, and produces a high-level check signal X when a voltage applied to the terminal $20_1$ for the address bit $AD_1$ is greater than a predetermined voltage. The selection circuit 17 also produces a high-level check signal Y when a voltage applied to the terminal $20_n$ for the address bit $AD_n$ is greater than a predetermined voltage.

Figure 2:
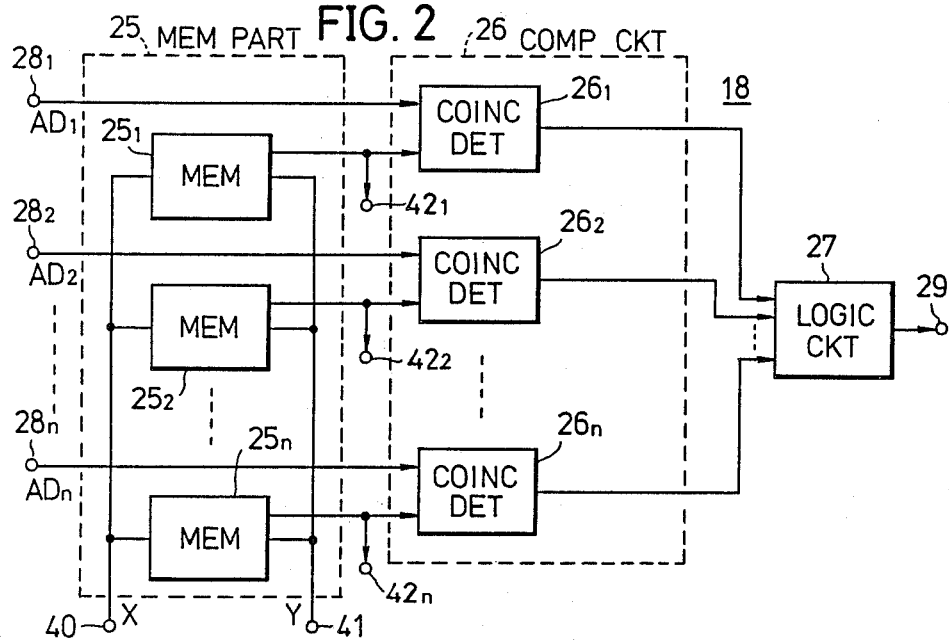
FIG. 2 is a system block diagram showing an embodiment of a redundancy control circuit in the semiconductor device shown in FIG. 1.

FIG. 2 shows an embodiment of the redundancy control circuit 18. The redundancy control circuit 18 comprises a memory part 25 comprising memories $25_1$ through $25_n$, a comparing circuit 26 comprising coincidence detecting circuits $26_1$ through $26_n$, and a logic circuit 27 comprising an AND circuit.

Figure 3:
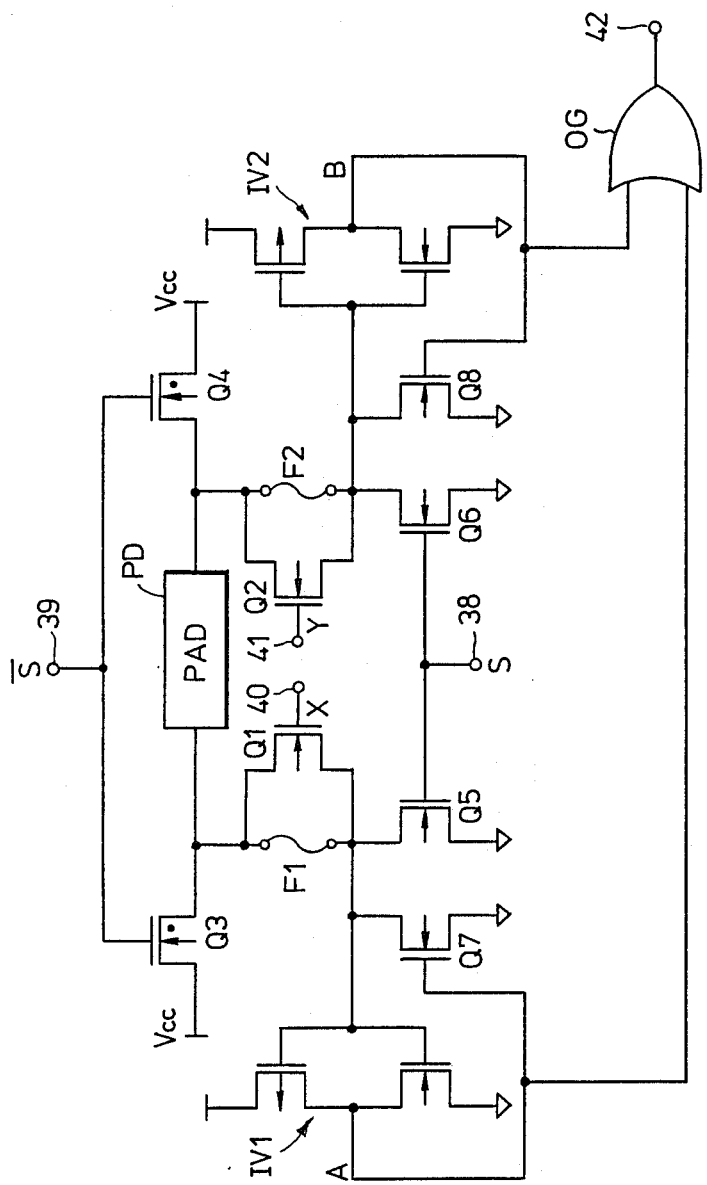
FIG. 3 is a circuit diagram showing an essential part of the redundancy control circuit shown in FIG. 2.

The memories $25_1$ through $25_n$ respectively have a circuit construction shown in FIG. 3. The memory comprises a memory circuit and a detecting circuit. The memory circuit comprises a pair of polysilicon fuses F1 and F2, transistors Q3 through Q8, inverters IV1 and IV2, a pad PD for blowing the fuse and terminals 38 and 39 for respectively receiving program signals S and $\bar{S}$. The detecting circuit comprises transistors Q1 and Q2, an OR gate OG and terminals 40 and 41 for respectively receiving the check signals X and Y.

When programming the memory, the program signals S and $\bar{S}$ are respectively applied to the terminals 38 and 39. The transistors Q3 and Q4 are depletion mode N-channel transistors and are turned OFF in response to the program signal $\bar{S}$. As a result, the memory is cut off from a power source voltage Vcc. On the other hand, the transistors Q5 and Q6 are enhancement mode N-channel transistors and are turned ON in response to the program signal S.

A high voltage is applied to the pad PD so that a large current flows through the fuses F1 and F2, creating an open circuit at F1 and F2. In this case, since the transistors Q3 and Q4 are OFF, a power source (not shown) for supplying the power source voltage Vcc will be unaffected by the high voltage applied to the pad PD.

When the application of the program signals S and $\bar{S}$ to the terminals 38 and 39 is then stopped, the transistors Q3 and Q4 are turned ON and the transistors Q5 and Q6 are turned OFF. Hence, the power source voltage Vcc is normally supplied to the memory.

In the case where the fuses F1 and F2 are completely blown and no grow back occurs, output signals A and B of the inverters IV1 and IV2 both have a high level, and a high-level signal is produced by the OR gate OG. This high-level signal from the OR gate OG obtained via terminal 42 indicates that the programming for using the redundancy memory cell in place of the defective memory cell within the memory cell array 11 is completed.

Figure 4:
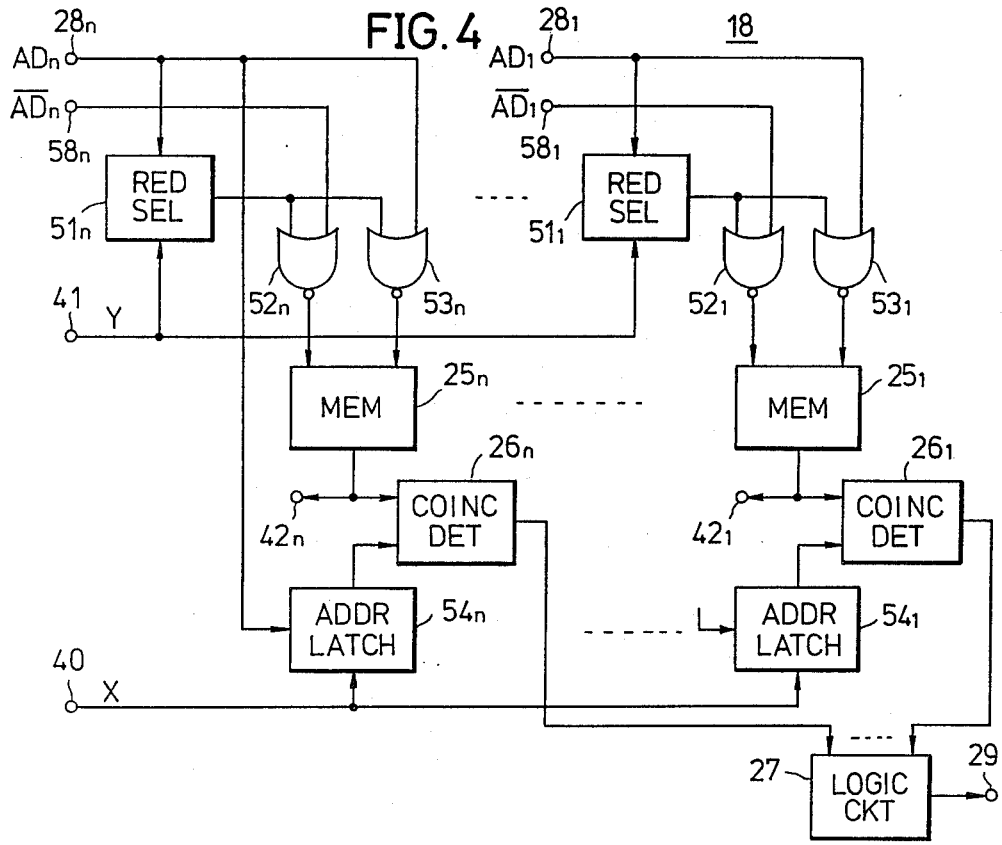
FIG. 4 is a system block diagram showing another embodiment of the redundancy control circuit in the semiconductor device shown in FIG. 1.

In FIGS. 1, 2 and 4, terminals corresponding to the terminal 42 shown in FIG. 3 are designated by reference numerals $42_1$ through $42_n$.

In addition, in the case where either one of the fuses F1 or F2 is unblown or has grown back, the level of a corresponding output signal A or B of the inverters IV1 and IV2 becomes low while the level of the other remains high. However, the output signal level of the OR gate OG is also remains high in this case, and it is indicated that the programming is completed.

On the other hand, when neither the fuse F1 nor F2 is blown, the output signals A and B of the inverters IV1 and IV2 both have a low level, and the output signal level of the OR gate OG in this case is low. This low level output of the OR gate OG indicates that no programming has taken place.

When only one of the fuses F1 and F2 is blown, it is possible to detect which one of the two fuses F1 and F2 is unblown by applying appropriate check signals X and Y to the terminals 40 and 41. For example, when a high-level check signal X is applied to the terminal 40 and a low-level check signal Y $(=\overline{X})$ is applied to the terminal 41, it is possible to detect that the fuse F2 is unblown when a low-level signal is obtained from the OR gate OG. Similarly, when a high-level check signal Y is applied to the terminal 41 and a low-level check signal X $(=\overline{Y})$ is applied to the terminal 40, it is possible to detect that the fuse F1 is unblown when a low-level signal is obtained from the OR gate OG. Therefore, it is possible to positively detect which one of the two fuses F1 and F2 is actually unblown by carrying out a simple operation.

Returning now to the circuit shown in FIG. 2, each of the coincidence detecting circuits $26_1$ through $26_n$ detects whether the corresponding bit of the input address from terminals $28_1$ through $28_n$ coincides with the output signal of the OR gate OG for a corresponding memory $25_1$ through $25_n$. The coincidence detecting circuits $26_1$ through $26_n$ each produce a high-level signal when the two input signals thereof coincide. The logic circuit 27 obtains a logical product of all of the output signals of the coincidence detecting circuits $26_1$ through $26_n$. When the input address coincides with the address of a defective memory cell within the memory cell array 11, all of the output signals of the coincidence detecting circuits $26_1$ through $26_n$ have a high level, and the logic circuit 27 produces a high-level signal which is obtained via a terminal 29. For example, this high-level signal is supplied to the redundancy row decoder 19 as the enable signal b. The enable signal b is inverted and is supplied to the row decoder 13 as the disable signal a.

FIG. 4 shows another embodiment of the redundancy control circuit 18 shown in FIG. 1. In FIG. 4, those parts which are the same as those corresponding parts in FIG. 2 are designated by the same reference numerals, and a description thereof will be omitted. The address bits $AD_1$ through $AD_n$ of the input address are respectively applied to the terminals $28_1$ through $28_n$, and inverted address bits $\overline{AD_1}$ through $\overline{AD_n}$ are respectively applied to terminals $58_0$ through $58_n$. The check signals X and Y are respectively applied to terminals 40 and 41.

The redundancy control circuit 18 comprises n circuit parts each comprising a redundancy circuit selection circuit $51_j$, 2-input NOR circuits $52_j$ and $53_j$, an address latch circuit $54_j$, the memory circuit $25_j$, coincidence detecting circuit $26_j$, and logic circuit 27, where j=0, 1, ..., n.

The address bit $AD_j$ from the terminal $28_j$ is supplied to the redundancy circuit selection circuit $51_j$, one input terminal of the NOR circuit $53_j$, and the address latch circuit $54_j$. The inverted address bit $\overline{AD_j}$ from the terminal $58_j$ is supplied to one input terminal of the NOR circuit $52_j$. The output signal from redundancy circuit selection circuit $52_j$ is supplied to the other input terminal of the NOR circuit $52_j$ and to the other input terminal of the NOR circuit $53_j$. Output signals of the NOR circuits $52_j$ and $53_j$ are respectively supplied to the terminals of the memory $25_j$ (not shown), corresponding to the terminals 40 and 41 shown in FIG. 3. The coincidence detecting circuit $26_j$ detects the coincidence of the output signal from memory $25_j$ and an output signal from address latch circuit $54_j$.

The address latch circuit $54_j$ latches the address bit $AD_j$ responsive to the check signal X from terminal 40. For example, a latch circuit is used for the redundancy circuit selection circuit $51_j$ so as to latch the address bit $AD_j$ responsive to the check signal Y from terminal 41. In this embodiment, the redundancy circuit selection circuit $51_j$ produces a high-level signal when the check signal Y has a low level, and latches the address bit $AD_j$ responsive to a high level of the check signal Y. The output signal level of the redundancy circuit selection circuit $51_j$ becomes low only when a high-level address bit $AD_j$ is latched therein. Accordingly, it is possible to select one of the memories $25_1$ through $25_n$ and check the state of each pair of fuses within each memory.

In the embodiments described heretofore, the present invention is applied to the semiconductor memory device having the redundancy configuration. However, the application of the present invention is not limited to the semiconductor memory device. For example, fuses are often used to select one or a plurality of circuit elements such as resistors provided within a semiconductor device. In this case, a selection circuit selects a certain connection of the circuit elements in order to obtain a desired circuit operation, and a memory circuit stores address information for controlling the selection circuit. Moreover, in such a semiconductor device having circuit elements which are to be selectively used, it is conceivable to employ the arrangement previously proposed in the U.S. Pat. No. 4,592,025 wherein a pair of fuses is provided for one bit of the address information, and the present invention can be applied similarly to the case of the embodiments described heretofore.

Further, the present invention is not limited to these embodiments, but various variations and modifications may be made without departing from the scope of the present invention.

What is claimed is:

1. A semiconductor device comprising:
   first and second power supply terminal means, each for receiving a power supply voltage;
   fuse circuit memory means, having first and second fuses, each being in either a blown state or an unblown state and being operatively connected between said first and second power supply terminals, for storing information;
   information output circuit means, operatively connected to said fuse circuit means, for providing an output signal having a first logic level when at least one of the fuses is in the blown state and a second logic level when both of the fuses are in the unblown state; and
   first check signal receiving means, for receiving a first check signal having a predetermined logic level;
   second check signal receiving means, for receiving a second check signal having a predetermined logic level;
   detecting circuit means, operatively connected to said fuse circuit means, for detecting which of the first and second fuses is in the unblown state, said detecting circuit means including
- a first transistor connected to said first check signal receiving means and to the first fuse in parallel and being turned ON in response to the first check signal, and
- a second transistor connected to said second check signal receiving means and to the second fuse in parallel and being turned ON in response to the second check signal.

2. A semiconductor device according to claim 1, wherein said information output circuit means includes means for producing said output signal having the second logic level to indicate that said second fuse is in the unblown state when the first check signal is applied to said first transistor, and for producing said output signal having the second logic level to indicate that said first fuse is in the unblown state when the second check signal is applied to said second transistor.

3. A semiconductor device according to claim 1 wherein said information output circuit means comprises OR circuit means for providing a logic sum output according to the logic levels of said first and second fuses when the first and second check signals are respectively received by said first and second transistors.

4. A semiconductor device according to claim 1, wherein said semiconductor device further comprises a memory cell array, and wherein said fuse circuit means includes means for storing address information of defective memory cells in said memory cell array.

* * * * *